(12) United States Patent
Kiyotoshi

(10) Patent No.: US 6,891,218 B2
(45) Date of Patent: May 10, 2005

(54) SEMICONDUCTOR DEVICE AND METHOD OF MANUFACTURING SAME

(75) Inventor: Masahiro Kiyotoshi, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/653,209

(22) Filed: Sep. 3, 2003

(65) Prior Publication Data

US 2004/0169216 A1 Sep. 2, 2004

(30) Foreign Application Priority Data

Feb. 28, 2003 (JP) ........................................ 2003-053184

(51) Int. Cl.⁷ ...................... H01L 27/108; H01L 29/76; H01L 29/94; H01L 31/119
(52) U.S. Cl. ...................... 257/310; 257/296; 438/240
(58) Field of Search .................................. 257/310, 311, 257/295, 296, 303; 438/240

(56) References Cited

U.S. PATENT DOCUMENTS 6,821,839 B2 * 11/2004 Chung ....................... 438/240

2004/0104420 A1 * 6/2004 Coolbaugh et al. ......... 257/310

FOREIGN PATENT DOCUMENTS

| JP | 2000-183289 | 6/2000 |
| JP | 2000-208720 | 7/2000 |
| JP | 2001-274340 | 10/2001 |

* cited by examiner

Primary Examiner—Phat X. Cao
(74) Attorney, Agent, or Firm—Finnegan, Henderson, Farabow, Garrett & Dunner, L.L.P.

(57) ABSTRACT

A semiconductor device comprises a semiconductor substrate, and a capacitor provided above the semiconductor substrate, the capacitor comprises a lower electrode containing metal, a first dielectric film provided above the lower electrode and containing tantalum oxide or niobium oxide, a top surface of the first dielectric film including a projecting portion, an upper electrode provided above the projecting portion of the first dielectric film and containing metal, a second dielectric film provided between the lower electrode and the first dielectric film and having a lower permittivity than the first dielectric film, and a third dielectric film provided between the projecting portion of the first dielectric film and the upper electrode and having a lower permittivity than the first dielectric film.

10 Claims, 4 Drawing Sheets

SEMICONDUCTOR DEVICE AND METHOD OF MANUFACTURING SAME

CROSS-REFERENCE TO RELATED APPLICATIONS

This application is based upon and claims the benefit of priority from the prior Japanese Patent Application No. 2003-053184, filed Feb. 28, 2003, the entire contents of which are incorporated herein by reference.

BACKGROUND OF THE INVENTION

1. Field of the Invention

The present invention relates to a semiconductor device including a capacitor, more particularly to an MIM (metal-insulator-metal) capacitor, and a method of manufacturing the semiconductor device.

2. Description of the Related Art

In recent years, with advances in communication techniques, an increasing number of personal computers (PCs) and personal digital assistants (PDAs) have been connected to networks and thereby used. Also home-use electrical appliances (such as VCRs, refrigerators, and air conditioners) are predicted to be connected to networks and to thereby be used in the future.

To configure a network with a large number of such devices as described above, a networking method used in, for example, offices in such a manner that LAN (local area network) cables are routed between individual devices is not suitable for use in ordinary homes, and wireless connection using wireless services is considered for employment as the mainstream connection in the future. As such, in the future, it is considered most LSI chips will have RF (radio frequency) communication functions added.

Conventionally, an LSI of the aforementioned type is formed of a plurality of chips, e.g. chips of RF analog devices (such as SiGe-BiCMOSs) and chips of CMOS logic devices. For PDAs and the like, miniaturization is viewed as important, and the LSI is demanded to be miniaturized using an RF-embedded LSI. In the RF-embedded LSI, an RF analog device and a CMOS logic device are integrated into a single chip.

To integrate the RF analog device and the CMOS logic device into a single chip, manufacturing processes for the two devices need to be integrated. The RF analog device is configured from, for example, resistors, inductances, and capacitors. The CMOS logic device is configured from a plurality of MOS transistors. As such, to realize the RF-embedded LSI, for example, a process for the RF analog device needs to be integrated with a CMOS logic process set as a base, a new RF-CMOS process needs to thereby be developed.

In integration of the two processes, problems first arise regarding an MIM capacitor and the structure thereof. The reasons for this are described hereunder.

One feature of the MIM capacitor for the RF analog device in the RF-embedded LSI is that the capacitor area is as large as several hundred square microns. As such, decreasing the capacitor area, i.e., increasing the capacitor capacitance per unit area is very important for decreasing the chip area and for increasing Q values of circuits.

In addition, good pairability is required for MIM capacitors for the RF analog device for the reason described hereunder. The RF analog circuit includes an arithmetic circuit that obtains output differentials by using symmetric circuits. In this configuration, capacitors used in pairs in the arithmetic circuit are required to match one another in capacitance and sensitivity with very high accuracy.

A technique conventionally used for a capacitor of a DRAM in which a three-dimensional electrode is introduced to increase the side area of the electrode is not effective to increase the capacitance density of the MIM capacitor having a large area. The reason is as follows.

An area (S1) of a DRAM capacitor in a top view is very small. As such, in the case where an electrode is three-dimensionally structured to increase a side area (S2), the ratio of S2/S1 increases to be very high. For this reason, for the DRAM capacitor, the capacitance density can easily be increased by three-dimensionally structuring the electrode.

However, compared with the DRAM capacitor, the capacitor used for the RF-embedded LSI has a very large area S1. As such, even when S2 is enlarged to a certain extent, the ratio of S2/S1 is not increased so much. Suppose the ratio of S2/S1 is to be sufficiently increased in the simple way that the electrode is formed columnar. In this case, the electrode needs to be as high as several tens of microns. However, such a high electrode is impractical.

To increase S2 without using such a high electrode, a technique for forming a large number of small concave and convex portions on sidewalls of an electrode. However, when such an electrode having such an intricate shape, it is difficult to realize an MIM capacitor having good pairability.

Another conceivable technique for increasing the capacitance density without forming the three-dimensional electrode structure is that a high-permittivity material, such as tantalum oxide ($Ta_2O_5$) or niobium oxide ($Nb_2O_5$), is used instead of conventionally used silicon nitride as a material for the dielectric film of the MIM capacitor. (The high-permittivity material is disclosed in, for example, Jpn. Pat. Appln. KOKAI Publication Nos. 2000-183289 and 2000-208720.)

BRIEF SUMMARY OF THE INVENTION

A semiconductor device according to an aspect of the present invention comprises a semiconductor substrate; and a capacitor provided above the semiconductor substrate, the capacitor comprises a lower electrode containing metal; a first dielectric film provided above the lower electrode and containing tantalum oxide or niobium oxide, a top surface of the first dielectric film including a projecting portion; an upper electrode provided above the projecting portion of the first dielectric film and containing metal; a second dielectric film provided between the lower electrode and the first dielectric film and having a lower permittivity than the first dielectric film; and a third dielectric film provided between the projecting portion of the first dielectric film and the upper electrode and having a lower permittivity than the first dielectric film.

A method of manufacturing a semiconductor device according to an aspect of the present invention comprises preparing a semiconductor substrate; forming a capacitor above the semiconductor substrate, the capacitor comprising a lower electrode containing metal, a multilayer dielectric film, and an upper electrode smaller than the lower electrode and containing metal; forming the capacitor comprises forming a first conductive film to be processed into the lower electrode; forming a first dielectric film containing tantalum oxide or niobium oxide, a second dielectric film, and a third dielectric film, the second dielectric film being formed on the first conductive film, the first dielectric film being formed on the second dielectric film, the third dielectric film being formed on the first film, the second dielectric film and the third dielectric film each having a permittivity lower than the first dielectric film; forming a second conductive film to be processed into the upper electrode on the third dielectric film; etching the second conductive film, and forming the upper electrode; etching the third dielectric film, and removing a portion of the third dielectric film, the portion extending outwardly further than a sidewall of the upper electrode; and etching the first dielectric film, and removing a portion of the first dielectric film, the portion extending from an upper surface of the first dielectric film to a midway depth of the first dielectric film and extending outwardly further than a sidewall of the upper electrode.

DETAILED DESCRIPTION OF THE INVENTION

First, a description will be provided regarding the results of research, investigations, and the like carried out by the present inventor, based on which the present invention has been developed.

As has been described above, the technique can be considered in which the high-permittivity material, such as tantalum oxide or niobium oxide, is used as a material for the MIM capacitor to increase the capacitance density without forming the three-dimensional electrode structure.

Particularly, the tantalum oxide is an optimum material to realize a capacitor with a low leakage current and a high capacitance density. A reason for this is that the tantalum oxide exhibits a high permittivity of about 30 even in an amorphous state. Another reason is that the crystallizing temperature of the tantalum oxide is as high as approximately 700° C. (generally, when a tantalum oxide material crystallizes, it produces an increased leakage current).

In this connection, the present inventor conducted extensively research and investigations, and as a result, found out and learned the following. The capacitor using the tantalum oxide film or the niobium oxide film is inferior in pairability to a conventional capacitor using a silicon nitride film (PECVD-SIN film (PECVD: plasma enhanced chemical vapor deposition)) formed by a PECVD process.

The research and investigations were therefore further continued to clear up the causes of the above. The results were as described hereunder.

Figure 1A:
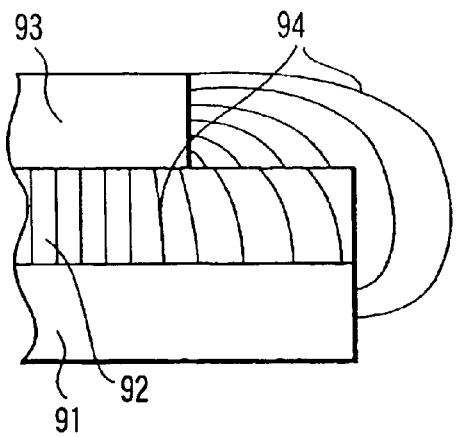
FIGS. 1A and 1B are views individually depicting electric flux lines occurring in a conventional capacitor.

When a voltage is applied to the capacitor, electric charges are stored in the capacitor. In this case, as shown in FIG. 1A, most parts of electric flux lines 94 are formed to be straight to connect between an upper electrode 93 and a lower electrode 91 via a dielectric film 92 at a shortest distance. However, the electric flux lines 94 overflow beyond the peripheral portions of the capacitor. In general, the degree of the overflow of the electric flux lines 94 is greater in a capacitor of an RF analog circuit in which the lower electrode 91 is larger than the upper electrode 93 than a capacitor in which an upper electrode and a lower electrode are approximately same in size.

The electric flux lines 94 overflowed to the outside of the capacitor are influenced by electric charges, electric fields, magnetic fields, and the like generated around the capacitor. Accordingly, the flowed-out electric flux lines 94 influence response characteristics of the capacitor.

An MIM capacitor has an outer circumference of some hundreds of microns. As such, the MIM capacitor is significantly influenced by peripheral disturbances. Unlike a DRAM capacitor, an MIM capacitor used in an analog circuit is required to be sufficient in the response characteristics, such as linearity and pairability.

The MIM capacitor described above is significantly influenced by crosstalk between electric flux lines overflowed to the outside of the capacitor and electric fields as well as magnetic fields. Accordingly, also the characteristics of the analog circuit using the MIM capacitor are significantly influenced by the crosstalk.

Of course, problems associated with such disturbances as described above occur with the conventionally used MIM capacitor including a silicon nitride film as a dielectric film.

Figure 1B:
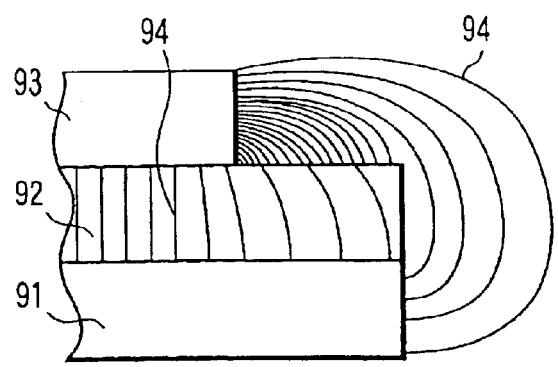

However, as shown in FIG. 1B, in the case where, for example, tantalum oxide or alumina (aluminum oxide) is used for the dielectric, the electric flux lines 94 overflow even more significantly to the outside of the capacitor (the density of the electric flux lines 94 represents the electric field intensity). FIG. 1B shows the electric flux lines 94 in a state where external electric fields of the capacitor become to have the same intensity as that shown in FIG. 1A.

Each of interlayer insulation films (not shown) covering the capacitors of FIGS. 1A and 1B is, typically, a $SiO_2$-based insulation film having a permittivity of approximately 3 to 4. Accordingly, the permittivity of the dielectric film 92 is greater than the permittivity of the interlayer insulation film.

The density of the electric flux lines 94 continually varies in the direction perpendicular to the direction of the electric flux lines 94. However, the density of the electric flux lines 94 is allowed to vary only with surfaces of the upper electrode 93 and the lower electrode 91 or with interfaces of materials mutually different permittivities (between the upper electrode 93 and the dielectric film 92 and between the dielectric film 92 and the lower electrode 91).

As such, in the configuration using a high dielectric material, such as tantalum oxide, the electric fields, namely, the electric flux lines 94 are easy to overflow to the outside of the capacitor because of electric-field continuity. Accordingly, the densities of nearby electric flux lines 94 that are incident upon the dielectric film 92 of FIG. 1B much increase. This leads to deterioration in the pairability of the MIM capacitor using a high-permittivity film.

In an MIM capacitor using a dielectric material such as tantalum oxide or niobium oxide, an extremely low leakage current can be obtained by use of platinum as an electrode material.

Nevertheless, however, it became apparent that an MIM capacitor of this type arises another problem. The problem is that the tantalum oxide, the niobium oxide, or the like is undesirably reduced when titanium nitride or tantalum nitride is used, thereby making it difficult to realize a desired low leakage current.

Hereinbelow, high-capacitance-density MIM capacitors according to embodiments of the present invention that are capable of solving the above-described problems will be described with reference to the accompanying drawings.
(First Embodiment)

Figure 2:
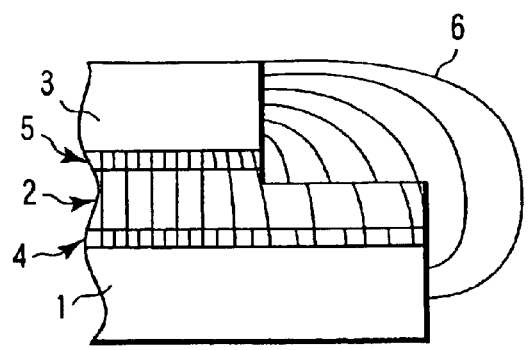
FIG. 2 is a view depicting a structure of an MIM capacitor according to a first embodiment of the present invention and electric flux lines occurring therein.

FIG. 2 is a view depicting the structure of an MIM capacitor according to a first embodiment and electric flux lines, the MIM capacitor using tantalum oxide or niobium oxide as a high dielectric material. FIG. 2 shows only a half side of the MIM capacitor. The MIM capacitor shown is formed above a silicon substrate, in which, for example, multilayered wiring layers and semiconductor devices, not shown, are formed between the silicon substrate and the MIM capacitor.

The MIM capacitor according to the present embodiment comprises a lower electrode 1, a first dielectric film 2, an upper electrode 3, a second dielectric film 4, and a third dielectric film 5. The first dielectric film 2 is provided above the lower electrode 1, and includes a projecting portion in a central portion of a top surface. The upper electrode 3 is provided above the projecting portion of the first dielectric film 2. The second dielectric film 4 is provided between the lower electrode 1 and the first dielectric film 2, and has a lower permittivity than the first dielectric film 2. The third dielectric film 5 is provided between the upper electrode 3 and the projecting portion of the first dielectric film 2, and has a lower permittivity than the first dielectric film 2.

The material of the lower electrode 1 and the upper electrode 3 is, for example, titanium nitride or tantalum nitride. The material of the first dielectric film 2 is, for example, tantalum oxide or niobium oxide (each of which has a permittivity of approximately 30).

With the titanium nitride or the tantalum nitride being used as the materials of the upper electrode 3, the materials of the first and third dielectric films 2 and 4 are each preferably at least one of alumina ($Al_2O_3$), silicon nitride, hafnium oxide, and zirconium oxide. Reasons for the preference are as described hereunder.

The dielectric material, described above, reacts with neither titanium nitride nor tantalum nitride. For this reason, the use the dielectric material enables the formation of good schottky barriers on an interface between the lower electrode 1 and the second dielectric film 4 and an interface between the upper electrode 3 and the third dielectric film 5. Thereby, leakage current can be reduced.

The permittivity of the dielectric material is in a range of from 7.5 to 20. The permittivity is lower than those of the tantalum oxide and the niobium oxide, and is higher than the permittivity (3 to 3.9) of a $SiO_2$ based interlayer dielectric film. Hence, the dielectric material is suitable to implement effects of the present embodiment.

Thus a structured MIM capacitor can be obtained in, for example, a manner described hereunder. The second dielectric film 4, the first dielectric film 2, the third dielectric film 5, and the upper electrode 3 (second conductive film) are deposited in that order over the lower electrode 1 (first conductive film). Thereafter, the upper electrode 3, the third dielectric film 5, and the first dielectric film 2 are sequentially etched.

In this stage, the periphery portions of the upper electrode 3 and third dielectric film 5 are etched and thereby removed completely. However, the peripheral portion of the first dielectric film 2 is etched and thereby removed only to a midway portion in depth.

In addition, the second dielectric film 4 is not etched at all. As such, the structure thus formed enables increase in leakage current to be prevented from occurring due to damage that can be caused by etching of the upper electrode 3, the third dielectric film 5, and the first dielectric film 2, and particularly, by etching of the first dielectric film 2.

An effective way of decreasing the leakage current is to reduce the upper electrode 3 to be as small as possible in comparison with the lower electrode 1 and to lengthen the distance between the sidewall of the upper electrode 3 and the sidewall of the lower electrode 1. When the upper electrode 3 is reduced in size, while the amount of stored charge is reduced, necessary amount of stored charge can be secured by use of the tantalum oxide or niobium oxide as the high dielectric material. Further, according to the present embodiment, even with the tantalum oxide or niobium oxide being used, deterioration in pairability is suppressed.

As shown in FIG. 2, in the MIM capacitor according to the present embodiment, electric flux lines 6 overflowing to the outside of the MIM capacitor are reduced in comparison to the case in the MIM capacitor shown in FIG. 2. Accordingly, crosstalk between the electric flux lines 6 and electric fields or magnetic fields in peripheral portions of the MIM capacitor is suppressed. The electric fields or the magnetic fields is caused by wiring in peripheral portions of the MIM capacitor.

The distribution of the electric flux lines 6 (electric field distribution) shown in FIG. 2 is those occurring in a configuration where tantalum oxide is used as a material of the first dielectric film 2, and alumina is used as materials of the first and third dielectric films 2 and 4.

The electric flux lines 6 overflowing to the outside of the MIM capacitor is suppressed for the following reason. The electric fields need to maintain continuity on the sidewall of the MIM capacitor (in the state shown in FIG. 2, the density of the electric flux lines 6 needs to be uniform). Consequently, the electric flux lines 6 are confined to the second dielectric film 4.

In addition, in the present embodiment, the third dielectric film 5, the permittivity of which is lower than an approximately half (<15) of the permittivity of the first dielectric film 2, is provided between the upper electrode 3 and the first dielectric film 2. This works to reduce the permittivity in portions near the upper electrode 3 is reduced.

Consequently, because of continuity of electric field being maintained, exudation of the electric flux lines 6 passing through the first dielectric film 2 is reduced (FIG. 2) compared to the case where the upper electrode 3 is directly provided on the first dielectric film 2 (FIG. 1B). This also is a reason for the suppression of the electric flux lines 6 flowing to the outside of the MIM capacitor (electric-field exudation).

However, in terms of the capacitor of the MIM capacitor, it is disadvantageous to provide the third dielectric film 5, which has a permittivity lower than that of the first dielectric film 2, between the upper electrode 3 and the first dielectric film 2. As such, the thickness of the third dielectric film 5 is preferably thin.

Figure 3:
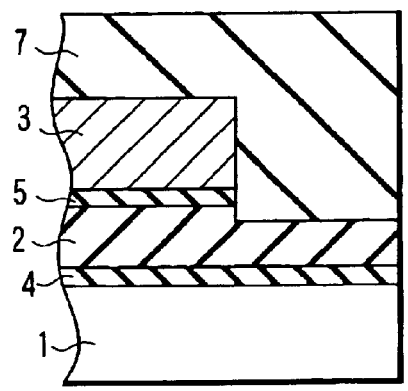
FIG. 3 is the MIM capacitor of a device according to the first embodiment.

In addition, as shown in FIG. 3, typically, an interlayer dielectric film 7 having a permittivity lower than that of the first dielectric film 2 is deposited over the MIM capacitor of the semiconductor device. As a result, the peripheral portions of the projecting portion of the first dielectric film 2 are surrounded by an interlayer dielectric film 39 (fourth dielectric film) of which the permittivity is lower than that of the first dielectric film 2. Thereby, the permittivities of portions near the upper electrode 3 are reduced, and the overflow of electric flux lines (electric-field exudation) to the outside of the MIM capacitor are reduced.

As described above, according to the present embodiment, even with the film such as the tantalum oxide film or niobium oxide film being used as the dielectric film, suppression can be implemented for the overflow of the electric flux lines 6 (electric-field exudation) to the outside of the MIM capacitor, which is the cause for degrading the pairability.

Thus, the present embodiment enables an MIM capacitor with high pairability, low leakage current, and high capacitance density to be realized. Thereby, the area of an RF-embedded LSI chip, which is predicted to be mounted in any devices in the future, can be reduced. Consequently, miniaturization of the devices can be implemented.

In the present embodiment, the second dielectric film 4 is provided in direct contact with the lower electrode 1 and the first dielectric film 2. However, the second dielectric film 4 may be provided in indirect contact with each of them via another film. Similarly, the third dielectric film 5 is provided in direct contact with the upper electrode 3 and the second dielectric film 4. However, the third dielectric film 5 may be provided in indirect contact each of them via another film.

(Second Embodiment)

FIGS. 4A to 4F are cross-sectional views showing manufacturing steps for a semiconductor device including an MIM capacitor according to a second embodiment of the present invention.

The upper electrode and the lower electrode of the MIM capacitor are individually titanium nitride films formed by a sputtering process. The dielectric film of the MIM capacitor is a multilayer dielectric film. This film includes a lower aluminum film (second dielectric film) formed by a reactive sputtering process, a tantalum oxide film (first dielectric film) formed by a reactive sputtering process on the lower aluminum film, an upper aluminum film (third dielectric film) formed by a reactive sputtering process on the tantalum oxide film.

Hereinbelow, a manufacturing method for the MIM capacitor according to the present embodiment will be described in detail.

Figure 4A:
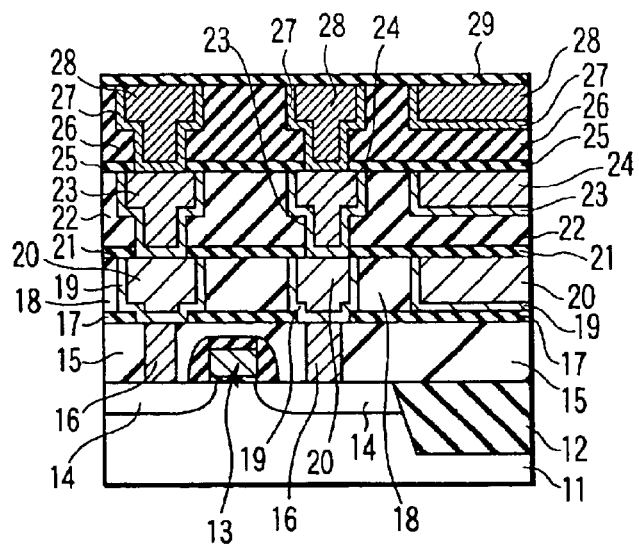
FIGS. 4A to 4F are cross-sectional views showing manufacturing steps for a semiconductor device including an MIM capacitor according to a second embodiment of the present invention.

FIG. 4A shows a silicon substrate including well-known a MOS transistor, a isolation regions, and multilayered wiring layers. In the present embodiment, the MIM capacitor is manufactured over the multilayered wiring layer.

The MIM capacitor of the present embodiment is, for example, a capacitor for an analog circuit, particularly, an analog circuit including an RF circuit (such as a noise filter of an RF receiving section). The RF circuit is provided in an RF-embedded LSI.

The well-known structure shown in FIG. 4A is formed by well-known standard logic process. Process for forming the structure shown in FIG. 4A will briefly be described hereinbelow.

First, a isolation region (STI) 12, a gate electrode section 13 (a gate insulation film, a gate electrode, a gate-upper-portion insulation film, and a gate-sidewall insulation film), and a source/drain region 14 are formed on a silicon substrate 11. Thereafter, an interlayer dielectric film 15 is deposited on the entire surface of the substrate, and the surface of the device face is then planarized. The source/drain region 14 has an LDD (lightly doped drain) structure (although the LDD structure is not shown).

Subsequently, the interlayer dielectric film 15 is etched, and contact holes are thereby formed. Then, plugs 16 are individually formed in the contact holes.

Subsequently, a silicon nitride film 17 and an interlayer dielectric film 18 are sequentially formed over the entire surface of substrate. Then, the interlayer dielectric film 18 and the silicon nitride film 17 are etched, and via-holes are thereby opened. Thereafter, using a dual damascene process, barrier metal films 19 are individually formed in the via-holes, and plugs 20 (DD (dual damascene) wirings) are formed therein. In this manner, a first metal wiring layer can be obtained. The barrier metal film 19 is, for example, a titanium nitride film; and the DD wiring 20 is, for example, a Cu-DD wiring. In the processing for the individual DD wirings, an embedding step with metals in wiring recesses and contact-holes is performed by, for example, electroplating processing.

After the above, in a manner similar to that for the first metal wiring layer, a silicon nitride film 21, an interlayer dielectric film 22, barrier metal films 23, DD wirings 24, a silicon nitride film 25, an interlayer dielectric film 26, barrier metal films 27, DD wirings 28, and a silicon nitride film 29 are formed. Thereby, second and third metal wiring layers can be obtained.

Figure 4C:
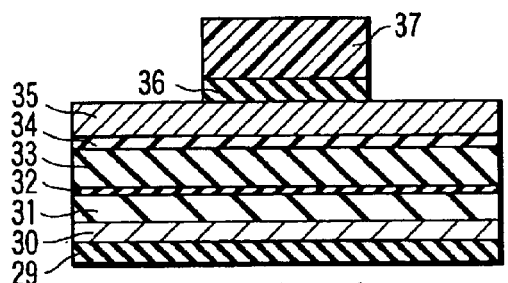
Figure 4B:
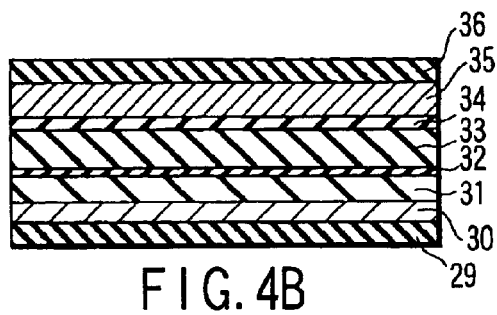

Subsequently, as shown in FIG. 4B, a titanium film 30 and a titanium nitride film 31 to be processed into the lower electrodes are sequentially formed by a sputtering process on the silicon nitride film 29. The titanium film 30 is electrically connected to the multilayered wiring layer through contact holes in the silicon nitride film 29 and plugs are formed in the contact holes. The plugs are titanium plugs formed synchronously with the titanium film 30 by using, for example, a dual damascene process.

Subsequently, as shown in FIG. 4B, a second dielectric film 32 of alumina (which hereinbelow will be referred to as a "lower aluminum film" in the present embodiment) is deposited on the titanium nitride film 31. The deposition is carried out by a reactive sputtering process using a aluminium metal target under the following conditions. A mixture gas of Ar and $O_2$ is used as a process gas, the deposition temperature is a room temperature, the Ar/$O_2$ flow ratio is 1.5, and the sputtering power is 1.8 kW. A sputtering device of a DC type is used. The thickness of the lower aluminum film 32 is 3 nm.

Subsequently, as shown in FIG. 4B, a first dielectric film 33 of tantalum oxide (which hereinbelow will be referred to as a "tantalum oxide film" in the present embodiment) is deposited on the lower aluminum film 32. The deposition is carried out by a reactive sputtering process using a tantalum metal target under the following conditions. A mixture gas of Ar and $O_2$ is used as a process gas, the deposition temperature is 200° C., the Ar/$O_2$ flow ratio is 1.3, and the sputtering power is 1 kW. A sputtering device of a DC type is used. The thickness of the tantalum oxide film 33 is 30 nm, and the permittivity thereof is 25.

Subsequently, as shown in FIG. 4B, a third dielectric film 34 of alumina (which hereinbelow will be referred to as a "upper aluminum film" in the present embodiment) is deposited on the tantalum oxide film 33 by using a reactive sputtering process. Then, without breaking vacuum, a titanium nitride film 35 to be processed into the upper electrode is continually formed by a sputtering process on the upper aluminum film 34. Thereafter, a silicon nitride film 36 is formed by a PECVD process on the titanium nitride film 35. The deposition conditions for the upper aluminum film 34 are the same as those for the lower aluminum film 32. The thickness of the upper aluminum film 34 is 8 nm.

Subsequently, as shown in FIG. 4C, a resist pattern 37 is formed on the silicon nitride film 36. Then, with the resist pattern 37 being used as a mask, the silicon nitride film 36 is etched. Thereby, a pattern of the resist pattern 37 is transferred onto the silicon nitride film 36. Thereafter, the resist pattern 37 is removed by ashing.

Figure 4D:
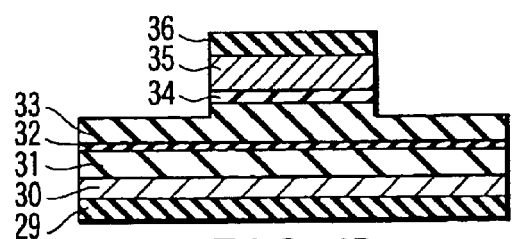

Subsequently, as shown in FIG. 4D, with the silicon nitride film 36 (hard mask) being used as a mask, the titanium nitride film 35 is etched by an RIE process using a fluorine-based etching gas. Then, the fluorine-based etching gas is replaced by a chlorine-based etching gas, and the upper aluminum film 34 is etched by an RIE process. Further, the chlorine-based etching gas is replaced by a mixture gas of a fluorine-based etching gas and an oxygen gas, and the tantalum oxide film 33 is approximately 5 nm deep etched for a specified time by using an RIE process. These processes result in obtaining the upper electrode 35 having a predetermined shape and the tantalum oxide film 33 having a projecting portion below the upper electrode 35.

Figure 4E:
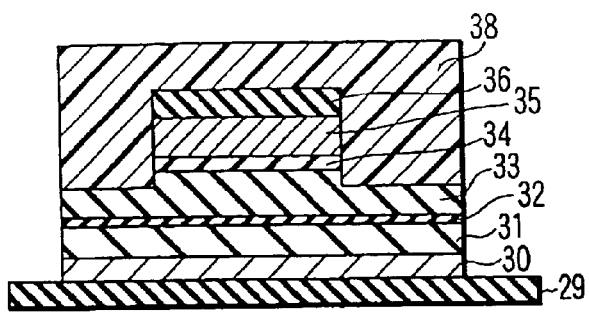

Subsequently, as shown in FIG. 4E, a resist pattern 38 is formed on the silicon nitride film 36 and the tantalum oxide film 33. Thereafter, with the resist pattern 38 being used as a mask, the tantalum oxide film 33, the lower alumina film 32, the titanium nitride film 31, and the titanium film 30 are sequentially etched by an RIE process. These processes result in obtaining the tantalum oxide film 33, the lower alumina film 32, and the lower electrodes 30 and 31, individually having predetermined shapes. Thereafter, the resist pattern 38 is removed by ashing.

Figure 4F:
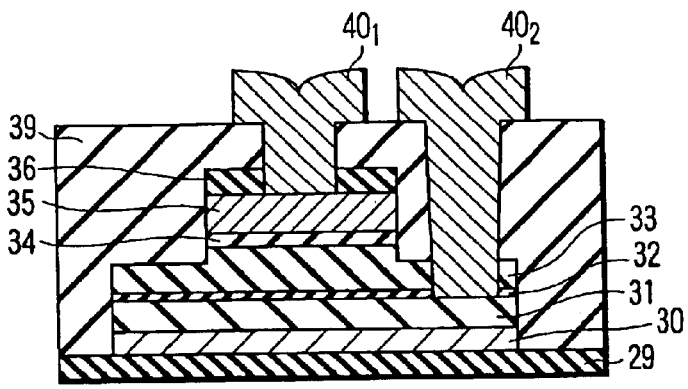
Figure 5:
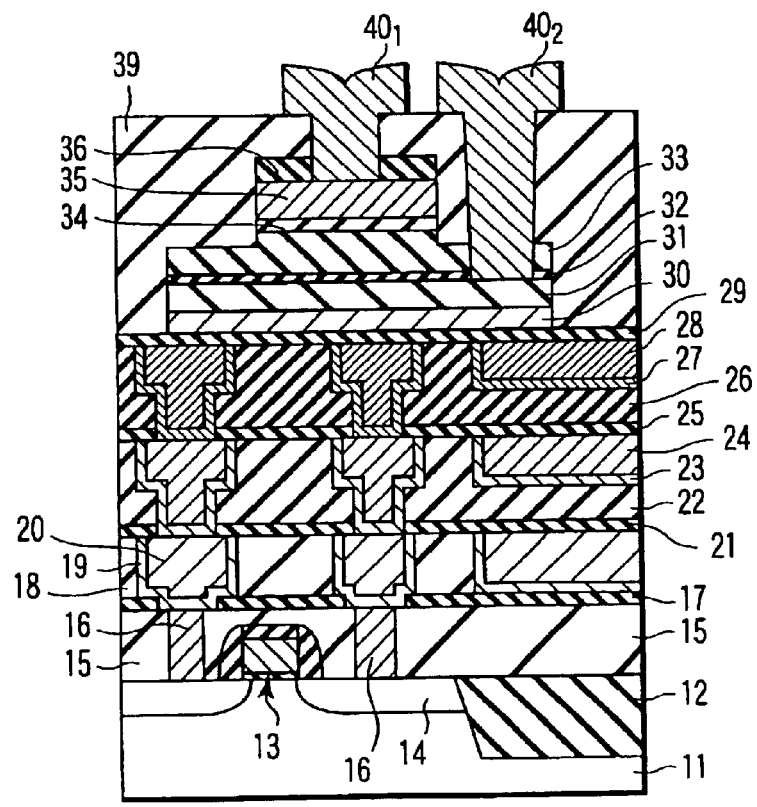
FIG. 5 is a cross-sectional view showing the semiconductor device including the MIM capacitor according to the second embodiment.
Figure 6A:
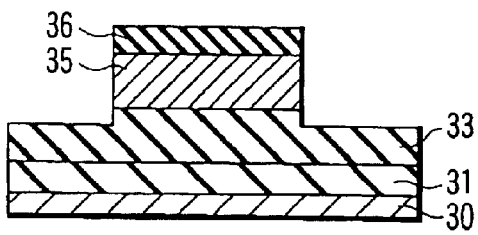
FIGS. 6A to 6G are cross-sectional views of comparative examples 1 to 7.
Figure 6E:
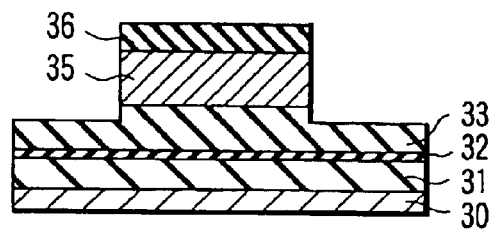
Figure 6B:
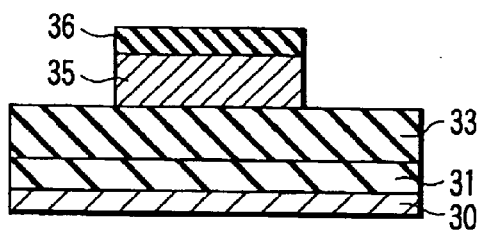
Figure 6F:
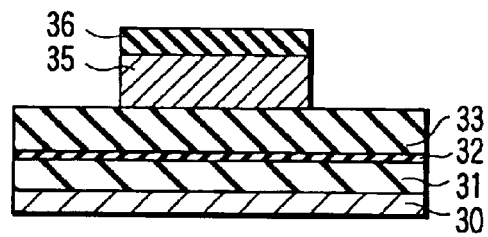
Figure 6C:
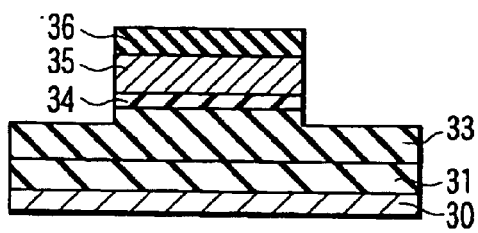
Figure 6G:
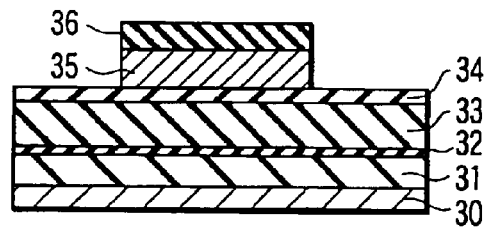
Figure 6D:
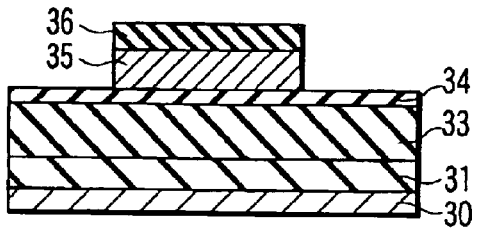

The steps described above complete a basic structure of the MIM capacitor. Thereafter, as shown in FIG. 4F, well-known steps follow. The steps to follow are, for example, a step of forming an interlayer dielectric film 39 over the entire surface of the substrate and a step of forming a lead-out electrode $40_1$ of the upper electrode 35 and a lead-out electrode $40_2$ of the lower electrode 31. A semiconductor device of the present embodiment, which has been obtained through the steps described above, is shown in FIG. 5 in a cross-sectional view.

The lead-out electrodes $40_1$ and $40_2$ are formed by processes described hereunder in detail. First, the interlayer dielectric film 39, the silicon nitride film 36, the tantalum oxide film 33, and the lower alumina film 32 are processed using a photolithography process and an RIE process. Thereby, a first contact hole, a second contact hole, and a third contact hole reaching respectively with the upper electrode 35, the lower electrode 31, and the multilayered wiring layer are formed. The RIE process uses a fluorine-based etching gas.

Subsequently, an aluminum film is formed by a sputtering process over the entire surface of the substrate so as to fill the insides of the first, second, and third contact holes. The aluminum film is then processed by a photolithography process and an RIE process. Thus, the lead-out electrodes $40_1$ and $40_2$ made of the aluminum film can be obtained.

The permittivity of the interlayer dielectric film 39 is preferably lower than the permittivity of the tantalum oxide film 33. This requirement can be satisfied since, generally, a dielectric film having a low permittivity, which is a so-called "low-k film", is used for the interlayer dielectric film 39.

The interlayer dielectric film 39 is thus formed over the entire surface of the substrate. As a result, the interlayer dielectric film 39 is formed on the peripheral portions of the projecting portion of the tantalum oxide film 33. That is, the peripheral portions of the projecting portion of the tantalum oxide film 33 are surrounded by the interlayer dielectric film 39 of which the permittivity is lower than the permittivity of the tantalum oxide film 33. This results in reducing the permittivities of portions near the silicon nitride film 36, thereby suppressing the overflow of electric flux lines (electric-field exudation) to the outside of the capacitor.

The capacitance of the MIM capacitor according to the present embodiment was 3.5 fF/$\mu$m$^2$. As in the first embodiment, the MIM capacitor with high pairability, a low leakage current, and a high capacitance density can be realized. Thereby, the area of an RF-embedded LSI chip, which is predicted to be mounted in any devices in the future, can be reduced. Consequently, miniaturization of the devices can be implemented.

As comparative examples 1 to 7 (references), the present inventor prepared seven MIM capacitors shown in FIGS. 6A to 6G. In the MIM capacitors of comparative examples 1 to 7, portions corresponding to those of the MIM capacitor of the present embodiment are shown with the same reference numerals as those used in the present embodiment. Portions corresponding to the silicon nitride film 29, the interlayer dielectric film 39, and the lead-out electrodes $40_1$ and $40_2$ are omitted for simplification.

The comparative example 1 (FIG. 6A) is an MIM capacitor in a state where one tantalum oxide film is used as the dielectric film, i.e. the lower and upper aluminum films 32 and 34 are removed from the MIM capacitor according to the present embodiment.

The comparative example 2 (FIG. 6B) is an MIM capacitor in a state where the lower and upper aluminum films 32 and 34 are removed from the MIM capacitor according to the present embodiment, and a flat tantalum oxide film 33 not having a projecting portion below the upper electrode 35 is provided.

The comparative example 3 (FIG. 6C) is an MIM capacitor using, as dielectric films, a tantalum oxide film and an aluminum film provided only between the tantalum oxide film and the upper electrode. That is, the MIM capacitor is in a state where the lower aluminum film 32 is removed from the MIM capacitor according to the present embodiment.

The comparative example 4 (FIG. 6D) is an MIM capacitor in a state where the lower aluminum film 32 is removed from the MIM capacitor according to the present embodiment and a flat-surface tantalum oxide film 33 not having a projecting portion below the upper electrode 35 is provided.

The comparative example 5 (FIG. 6E) is an MIM capacitor using, as dielectric films, a tantalum oxide film and an aluminum film provided only between the tantalum oxide film and the lower electrode. That is, the MIM capacitor is in a state where the upper aluminum film 34 is removed from the MIM capacitor according to the present embodiment.

The comparative example 6 (FIG. 6F) is an MIM capacitor in a state where the upper aluminum film 34 is removed from the MIM capacitor according to the present embodiment and a flat-surface tantalum oxide film 33 not having a projecting portion below the upper electrode 35 is provided.

The comparative example 7 (FIG. 6G) is an MIM capacitor that is the same as the MIM capacitor according to the present embodiment with an exception that the example MIM capacitor has a flat-surface tantalum oxide film 33 not having a projecting portion below the upper electrode 35.

The thicknesses of the tantalum oxide films 33 of the individual comparative examples 1 to 6 were chosen so that the capacitor capacitances thereof are the same as the capacitor capacitance of the tantalum oxide film 33 according to the present embodiment. The thickness of tantalum oxide film 33 of the comparative example 7 is the same as the capacitor capacitance of the tantalum oxide film 33 according to the present embodiment.

Table 1 shows capacitor pairability (3$\sigma$ matching) values and leakage current values evaluated under the conditions where a voltage of ±3.6V is applied at 100° C. regarding the comparative examples 1 to 7.

TABLE 1

|  | Projecting Portion | 3 σ matching | Leakage Current [+3.6 V] | Leakage Current [−3.6 V] |
| --- | --- | --- | --- | --- |
| Comparative Example 1 ($Ta_2O_5$) | Provided | 3.1% $\mu m^2$ | 2.7E−6A/$mm^2$ | 3.2E−6A/$mm^2$ |
| Comparative Example 2 ($Ta_2O_5$) | Not provided | 6.6% $\mu m^2$ | 8.2E−7A/$mm^2$ | 9.5E−7A/$mm^2$ |
| Comparative Example 3 ($Ta_2O_5/Al_2O_3$) | Provided | 2.9% $\mu m^2$ | 2.8E−11A/$mm^2$ | 1.5E−9A/$mm^2$ |
| Comparative Example 4 ($Ta_2O_5/Al_2O_3$) | Not provided | 6.5% $\mu m^2$ | 2.9E−11A/$mm^2$ | 2.1E−10A/$mm^2$ |
| Comparative Example 5 ($Al_2O_3/Ta_2O_5$) | Provided | 1.8% $\mu m^2$ | 1.5E−9A/$mm^2$ | 2.3E−9A/$mm^2$ |
| Comparative Example 6 ($Al_2O_3/Ta_2O_5$) | Not provided | 3.8% $\mu m^2$ | 2.1E−10A/$mm^2$ | 2.8E−11A/$mm^2$ |
| Embodiment ($Al_2O_3/Ta_2O_5/Al_2O_3$) | Provided | 1.4% $\mu m^2$ | 8.2E−12A/$mm^2$ | 8.8E−12A/$mm^2$ |
| Comparative Example 1 ($Al_2O_3/Ta_2O_5/Al_2O_3$) | Not provided | 4.4% $\mu m^2$ | 8.1E−12A/$mm^2$ | 8.5E−12A/$mm^2$ |

As seen from Table 1, the MIM capacitor (comparative example 1) using the flat-surface tantalum oxide film 33 is inferior in the pairability to the MIM capacitors (comparative examples 3 and 5 and the MIM capacitor according to the present embodiment) individually using the tantalum oxide film 33 having the projecting portion below the upper electrode 35.

In addition, as can be seen from the table that good pairabilities can be obtained in the configurations not using the triple-layer structure (embodiment) formed of the lower aluminum film 32, the tantalum oxide film 33, and the upper aluminum film 34, but using either the single-layer structure formed of the tantalum oxide film 33 having the projecting portion below the upper electrode 35 or the double-layer structure formed of the tantalum oxide film 33 having the projecting portion below the upper electrode 35 and the aluminum film 32 (or the upper aluminum film 34) However, the comparative examples described above are inferior in the leakage currents to the present embodiment because of the influence of the reaction between the tantalum oxide film 33 and the titanium nitride film 31 (or the upper electrode 35).

Further, as can be seen from the table that the leakage current indicates the somewhat low value in the configuration (comparative example 3) using the capacitor dielectric film having the double-layer structure in which the aluminum film is provided only on the side of lower electrode. At the same time, however, it can be seen from the table that, in the configuration (comparative example 5) using the capacitor dielectric film having the double-layer structure in which the aluminum film is provided only on the side of the upper electrode, the leakage current thereof is higher that that of the comparative example 3.

Causes for the above are considered to be as described hereunder. A manufacturing process for the capacitor using the tantalum oxide film 33 including the projecting portion below the upper electrode 35 includes a step of etching the tantalum oxide film 33 according to an RIE process (FIG. 4D). During this step, deficiency is formed in the tantalum oxide film 33. This deficiency causes a significant reduction in the insulating property of the tantalum oxide film 33, and the reduction in the insulating property is considered to cause the increase in the leakage current. From this, the present inventor came to know that it is indispensable to insert the dielectric film, such as then aluminum film, at least on the side of the lower electrode of the capacitor.

Further, it was proved that even in configurations using the tantalum oxide film 33 that has the projecting portion below the upper electrode 35, a higher pairability can be obtained in the configurations (comparative example 5 and the present embodiment) using the upper aluminum film 34 as the dielectric film contacting the upper electrode 35 than in the configurations (comparative examples 1 and 3) using the tantalum oxide film 33 as the dielectric film contacting the upper electrode 35.

Accordingly, it was proved that the provision of the dielectric film having a permittivity lower than that of the tantalum oxide between the upper electrode 35 and the tantalum oxide film 33 is effective not only to suppress the leakage current but also to implement good pairability.

(Third Embodiment)

An MIM capacitor according to the third embodiment is different from the MIM capacitor according to the second embodiment in that zirconium oxide ($ZrO_2$) films are used for the second and third dielectric films, and a niobium oxide film is used for the first dielectric film.

With respect to the structure, the MIM capacitor according to the present embodiment is the same as the MIM capacitor according to the second embodiment. Hence, a manufacturing method for a semiconductor device including the MIM capacitor according to the present embodiment will be described hereinbelow with reference to FIGS. 4A to 4F used in the description of the second embodiment.

Firstly, as shown in FIG. 4A, a silicon substrate including a MOS transistor, device-isolating regions, and multilayered wiring layers is manufactured using well-known processes.

Subsequently, as shown in FIG. 4B, a titanium film 30 and a titanium nitride film 31 are sequentially formed by a sputtering process on the silicon nitride film 29. Up to this stage, the same processes as those in the second embodiment are performed.

Subsequently, as shown in FIG. 4B, a second dielectric film 32 of zirconium oxide (which hereinbelow will be referred to as a "lower zirconium oxide film" in the present embodiment) is deposited on the titanium nitride film 31. The deposition is carried out by a reactive sputtering process using a tantalum metal target under the following conditions. A mixture gas of Ar and $O_2$ is used as a process gas, the deposition temperature is 300° C., the Ar/$O_2$ flow ratio is 1.00, and the sputtering power is 1.0 kW. A sputtering device of a DC type is used. The thickness of the lower zirconium oxide film 32 is 9 nm, and the permittivity thereof is 18.

Subsequently, as shown in FIG. 4B, a first dielectric film 33 of niobium oxide (which hereinbelow will be referred to as a "niobium oxide film" in the present embodiment) is deposited over the lower zirconium oxide film 32. The deposition is carried out by a reactive sputtering process using a niobium metal target under the following conditions. A mixture gas of Ar and O$_2$ is used as a process gas, the deposition temperature is 300° C., the Ar/O$_2$ flow ratio is 1.3, and the sputtering power is 1 kW. A sputtering device of a DC type is used. The thickness of the niobium oxide film 33 is 36 nm, and the permittivity thereof is 18.

Subsequently, as shown in FIG. 4B, a third dielectric film 34 of zirconium oxide (which hereinbelow will be referred to as a "upper zirconium oxide film" in the present embodiment) is deposited on the niobium oxide film 33 by using a reactive sputtering process. Then, without breaking vacuum, a titanium nitride film 35 for use as the upper electrode is continually formed by a sputtering process on the upper aluminum film 34. Thereafter, a silicon nitride film 36 is formed by a PECVD process on the titanium nitride film 35. The deposition conditions for the upper zirconium oxide film 34 are the same as those for the lower zirconium oxide film 32. The thickness of the upper zirconium oxide film 34 is 15 nm.

Subsequently, as shown in FIG. 4C, a resist pattern 37 is formed on the silicon nitride film 36. Then, with the resist pattern 37 being used as a mask, the silicon nitride film 36 is etched. Thereby, a pattern of the resist pattern 37 is transferred onto the silicon nitride film 36. Thereafter, the resist pattern 37 is removed by ashing.

Subsequently, as shown in FIG. 4D, with the silicon nitride film 36 being used as a mask, the titanium nitride film 35 is etched by an RIE process using a fluorine-based etching gas. Then, the fluorine-based etching gas is replaced by a chlorine-based etching gas, and the upper zirconium oxide film 34 is etched by an RIE process. Further, the chlorine-based etching gas is replaced by a mixture gas of a fluorine-based etching gas and oxygen gas, and the niobium oxide film 33 is approximately 5 nm deep etched for a specified time by using an RIE process. These processes result in obtaining the upper electrode 35 having a predetermined shape and the niobium oxide film 33 having a projecting portion below the upper electrode 35.

Subsequently, as shown in FIG. 4E, a resist pattern 38 is formed on the silicon nitride film 36 and the niobium oxide film 33. Thereafter, with the resist pattern 38 being used as a mask, the niobium oxide film 33, the lower zirconium oxide film 32, the titanium nitride film 31, and the titanium film 30 are sequentially etched by an RIE process. These processes result in obtaining the lower electrodes 30 and 31 individually having predetermined shapes. Thereafter, the resist pattern 38 is removed by ashing.

The steps described above complete a basic structure of the MIM capacitor. Thereafter, as shown in FIG. 4F, an interlayer dielectric film 39 is formed over the entire surface of the substrate, followed by well-known steps. The steps to follow include a step of forming a lead-out electrode 40$_1$ of the upper electrode 35 and a lead-out electrode 40$_2$ of the lower electrode 31, for example. A cross section of the semiconductor device of the present embodiment, which has been obtained through the steps described above, is the same as that shown in the cross-sectional view of FIG. 5.

The lead-out electrodes 40$_1$ and 40$_2$ are formed by processes described hereunder in detail. First, the interlayer dielectric film 39, the silicon nitride film 36, the niobium oxide film 33, and the lower zirconium oxide film 32 are processed using a photolithography process and an RIE process. Thereby, first, second, and third contact holes communicating respectively with the upper electrode 35, the lower electrode 31, and the multilayered wiring layer are formed. The RIE process uses a fluorine-based etching gas.

Subsequently, an aluminum film is formed by a sputtering process over the entire surface of the substrate so as to fill the insides of the first, second, and third contact holes. The aluminum film is then processed by a photolithography processing and an RIE process. Thus, the lead-out electrodes 40$_1$ and 40$_2$ made of the aluminum film can be obtained.

The capacitance of the MIM capacitor according to the present embodiment was 3.5 fF/$\mu$m$^2$. In addition, the pairability of the MIM capacitor according to the present embodiment was evaluated. The evaluation proved that, as in the second embodiment, good results were obtained; specifically, the resultant values were 2.1% $\mu$m$^2$ with 3$\sigma$ matching. Thus, as in the first embodiment, the MIM capacitor with a high pairability, a low leakage current, and a high capacitance density can be realized. Thereby, the area of an RF-embedded LSI chip, which is predicted to be mounted in any devices in the future, can be reduced. Consequently, miniaturization of the devices can be implemented.

(Fourth Embodiment)

An MIM capacitor according to the fourth embodiment is different from the MIM capacitor according to the second embodiment in that silicon nitride films are used for the second and third dielectric films, and a tantalum oxide film is used for the first dielectric film.

With respect to the structure, the MIM capacitor according to the present embodiment is substantially approximately the same as the MIM capacitor according to the second embodiment. As such, a manufacturing method for a semiconductor device including the MIM capacitor according to the present embodiment will be described with reference to the same FIGS. 4A to 4F, which were used in the description of the second embodiment.

Firstly, as shown in FIG. 4A, a silicon substrate including a MOS transistor, isolation regions, and multilayered wiring layers is manufactured using well-known processes.

Subsequently, as shown in FIG. 4B, a titanium film 30 and a titanium nitride film 31 are sequentially formed by a sputtering process on the silicon nitride film 29. Up to this stage, the same processes as those in the second embodiment are performed.

Subsequently, as shown in FIG. 4B, a second dielectric film 32 of silicon nitride (which hereinbelow will be referred to as a "lower silicon nitride film" in the present embodiment) is deposited on the titanium nitride film 31. The deposition is carried out by a reactive sputtering process using a sintered silicon nitride ceramic target under the following conditions. A mixture gas of Ar and N$_2$ is used as a process gas, the deposition temperature is 300° C., the Ar/N$_2$ flow ratio is 10, and the sputtering power is 1.0 kW. A RF type sputtering apparatus is used. The thickness of the lower silicon nitride film 32 is 2 nm, and the permittivity thereof is 7.5.

Subsequently, as shown in FIG. 4B, a first dielectric film 33 of tantalum oxide (which hereinbelow will be referred to as a "tantalum oxide film" in the present embodiment) is deposited on the lower silicon nitride film 32. The deposition is carried out by a reactive sputtering process using a tantalum metal target under the following conditions. A mixture gas of Ar and O$_2$ is used as a process gas, the deposition temperature is 200° C., the Ar/O$_2$ flow ratio is 1.5, and the sputtering power is 1.8 kW. A sputtering device of a DC type is used. The thickness of the tantalum oxide film 33 is 25 nm.

Subsequently, as shown in FIG. 4B, a third dielectric film 34 of silicon nitride (which hereinbelow will be referred to as an "upper silicon nitride film" in the present embodiment) is deposited on the tantalum oxide film 33 by using a reactive sputtering process. Then, without breaking vacuum, a titanium nitride film 35 for to be processed into the upper electrode is continually formed by a sputtering process on the upper aluminum film 34. Thereafter, a silicon nitride film 36 is formed by a PECVD process on the titanium nitride film 35. The deposition conditions for the upper silicon nitride film 34 are the same as those for the lower silicon nitride film 32. The thickness of the upper silicon nitride film 34 is 10 nm.

Subsequently, as shown in FIG. 4C, a resist pattern 37 is formed on the silicon nitride film 36. Then, with the resist pattern 37 being used as a mask, the silicon nitride film 36 is etched. Thereby, a pattern of the resist pattern 37 is transferred onto the silicon nitride film 36. Thereafter, the resist pattern 37 is removed by ashing.

Subsequently, as shown in FIG. 4D, with the silicon nitride film 36 being used as a mask, the titanium nitride film 35 is etched by an RIE process using a fluorine-based etching gas. In this step, since the upper aluminum film 34 is made of the same material as the mask (silicon nitride film 36), the upper aluminum film 34 is hardly etched.

Subsequently, as shown in FIG. 4D, the fluorine-based etching gas is replaced by a bromine-based etching gas, and the upper silicon nitride film 34 is etched by an RIE process. Further, the bromine-based etching gas is replaced by a mixture gas of a fluorine-based etching gas and an oxygen gas, and the tantalum oxide film 33 is approximately 5 nm deep etched for a specified time by using an RIE process. These processes result in obtaining the upper electrode 35 and the tantalum oxide film 33 having a projecting portion below the upper electrode 35.

Subsequently, as shown in FIG. 4E, a resist pattern 38 is formed on the silicon nitride film 36 and the tantalum oxide film 33. Thereafter, with the resist pattern 38 being used as a mask, the tantalum oxide film 33, the lower silicon nitride film 32, the titanium nitride film 31, and the titanium film 30 are sequentially etched by an RIE process. These processes result in obtaining the lower electrodes 30 and 31 individually having predetermined shapes. Thereafter, the resist pattern 38 is removed by ashing.

The steps described above complete a basic structure of the MIM capacitor. Thereafter, as shown in FIG. 4F, an interlayer dielectric film 39 is formed over the entire surface of the substrate, followed by well-known steps. The steps to follow include a step of forming a lead-out electrode $40_1$ of the upper electrode 35 and a lead-out electrode $40_2$ of the lower electrode 31, for example. A cross section of the semiconductor device of the present embodiment, which has been obtained through the steps described above, is the same as that shown in the cross-sectional view of FIG. 5.

The lead-out electrodes $40_1$ and $40_2$ are formed by processes described hereunder in detail. First, the interlayer dielectric film 39, the silicon nitride film 36, the tantalum oxide film 33, and the lower silicon nitride film 32 are processed using a photolithography process and an RIE process. Thereby, first, second, and third contact holes reaching respectively with the upper electrode 35, the lower electrode 31, and the multilayered wiring layer are formed. The RIE process uses a fluorine-based etching gas.

Subsequently, an aluminum film is formed by a sputtering process over the entire surface of the substrate so as to fill the insides of the first, second, and third contact holes. The aluminum film is then processed by a photolithography process and an RIE process. Thus, the lead-out electrodes $40_1$ and $40_2$ made of the aluminum film can be obtained.

The capacitance of the MIM capacitor according to the present embodiment was 3.5 fF/$\mu$m$^2$. In addition, the pair-ability of the MIM capacitor according to the present embodiment was evaluated. The evaluation proved that, as in the second and third embodiments, good results were obtained; specifically, the resultant values were 1.8% $\mu$m$^2$ with 3$\sigma$ matching. Thus, as in the first embodiment, the MIM capacitor with high pairability, a low leakage current, and a high capacitance density can be realized. Thereby, the area of an RF-embedded LSI chip, which is predicted to be mounted in any devices in the future, can be reduced. Consequently, miniaturization of the devices can be implemented.

In the individual embodiments, the multilayer film formed of the titanium film 30 and the titanium nitride film is used as each of the upper electrode 35 and the lower electrode 31. However, the multilayer film may be replaced with a single-layered conductive film that contains metals such as the titanium film 30, a tungsten nitride film or a tantalum nitride film. Alternatively, the multilayer film may be replaced with a multilayered conductive film that contains metals such as, titanium nitride film/AlCu film/titanium nitride film.

Further, while the titanium nitride film is used for the upper electrode 35 in the individual embodiments, any one selected from various conductive films may instead be used, as in the case of the lower electrode 31.

Furthermore, in the individual embodiments, while the silicon substrate is used, a SOI substrate, a SiGe substrate, or a strained silicon substrate may instead be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

a semiconductor substrate; and a capacitor provided above the semiconductor substrate, the capacitor comprising:

a lower electrode containing metal;

a first dielectric film provided above the lower electrode and containing tantalum oxide or niobium oxide, a top surface of the first dielectric film including a projecting portion;

an upper electrode provided above the projecting portion of the first dielectric film and containing metal;

a second dielectric film provided between the lower electrode and the first dielectric film and having a lower permittivity than the first dielectric film; and a third dielectric film provided between the projecting portion of the first dielectric film and the upper electrode and having a lower permittivity than the first dielectric film.

2. The semiconductor device according to claim 1, wherein the upper electrode, the third dielectric film, and the projecting portion of the first dielectric film each comprises same shape and same size as viewed from an upper position.

3. The semiconductor device according to claim 1, wherein the metal is titanium or tantalum.

4. The semiconductor device according to claim 2, wherein the metal is titanium or tantalum.

5. The semiconductor device according to claim 1, wherein a material of each of the second and third dielectric films is at least one of silicon nitride, aluminum oxide, hafnium oxide, and zirconium oxide.

6. The semiconductor device according to claim 2, wherein a material of each of the second and third dielectric films is at least one of silicon nitride, aluminum oxide, hafnium oxide, and zirconium oxide.

7. The semiconductor device according to claim 3, wherein a material of each of the second and third dielectric films is at least one of silicon nitride, aluminum oxide, hafnium oxide, and zirconium oxide.

8. The semiconductor device according to claim 1, further comprising a fourth dielectric film provided on the capacitor and having a lower permittivity than the first dielectric film.

9. The semiconductor device according to claim 2, further comprising a fourth dielectric film provided on the capacitor and having a lower permittivity than the first dielectric film.

10. The semiconductor device according to claim 3, further comprising a fourth dielectric film provided on the capacitor and having a lower permittivity than the first dielectric film.

* * * * *